(12) United States Patent
Kim et al.

(10) Patent No.: US 11,100,845 B1
(45) Date of Patent: Aug. 24, 2021

(54) COMPENSATION USING OPTICAL FEEDBACK FOR SELF-EMISSIVE PIXEL

(71) Applicant: Apple Inc., Cupertino, CA (US)

(72) Inventors: Hyunsoo Kim, Mountain View, CA (US); Hung Sheng Lin, San Jose, CA (US); Hyunwoo Nho, Palo Alto, CA (US); Injae Hwang, Cupertino, CA (US); Rui Zhang, Sunnyvale, CA (US); Shengkui Gao, San Jose, CA (US); Shiping Shen, Cupertino, CA (US); Sun-Il Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/563,452

(22) Filed: Sep. 6, 2019

Related U.S. Application Data

(60) Provisional application No. 62/728,607, filed on Sep. 7, 2018.

(51) Int. Cl.
*G09G 3/32* (2016.01)
*H01L 27/32* (2006.01)
*H01L 51/52* (2006.01)

(52) U.S. Cl.
CPC ........... *G09G 3/32* (2013.01); *H01L 27/3269* (2013.01); *H01L 51/5209* (2013.01); *G09G 2320/0233* (2013.01); *G09G 2320/045* (2013.01); *G09G 2360/145* (2013.01); *H01L 2251/558* (2013.01)

(58) Field of Classification Search
CPC ............. G09G 3/32; G09G 2320/0233; G09G 2320/045; G09G 2360/145; H01L 27/3269; H01L 51/5209; H01L 2251/558
See application file for complete search history.

(56) References Cited

U.S. PATENT DOCUMENTS

| | | | |
|---|---|---|---|
| 2003/0021307 A1* | 1/2003 | Yamazaki | B23K 26/0648 372/24 |
| 2019/0004650 A1* | 1/2019 | Ma | H01L 27/3262 |
| 2019/0067626 A1* | 2/2019 | Shimogawara | H01L 51/5237 |

* cited by examiner

*Primary Examiner* — Kenneth B Lee, Jr.
(74) *Attorney, Agent, or Firm* — Fletcher Yoder P.C.

(57) ABSTRACT

A device may include a photosensitive transistor and a light-emitting diode. The light-emitting diode may include an anode. The anode may include a first portion having a first thickness and a second portion having a second thickness, wherein the second thickness is less than the first thickness. The device may also include driving circuitry that receives a data signal and causes light to emit from the light-emitting diode in response to the data signal. The photosensitive transistor may generate an electrical signal in response to light emitted from the light-emitting diode during the light emission.

20 Claims, 8 Drawing Sheets

COMPENSATION USING OPTICAL FEEDBACK FOR SELF-EMISSIVE PIXEL

CROSS REFERENCE TO RELATED APPLICATIONS

This application claims priority to U.S. Provisional Patent Application No. 62/728,607, entitled "Compensation Using Optical Feedback for Self-Emissive Pixel," filed Sep. 7, 2018, which is incorporated herein by reference in its entirety for all purposes.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Methods and systems for compensating for non-uniform properties between pixels of an electronic display may substantially improve the visual appearance of an electronic display by reducing perceivable visual artifacts. The systems to perform the compensation may be outside of an electronic display and/or an active area of the electronic display, in which case they may be understood to provide a form of external compensation, or the systems to perform the compensation may be located within the electronic display. The compensation itself may take place in a digital domain or an analog domain, the net result producing an adjusted data signal transmitted to each pixel of the electronic display before the data signal is used to cause the pixel to emit light. Because the adjusted data signal has been compensated to account for the non-uniform properties of the pixels, the images resulting from the data signals transmitted to the pixels may have substantially reduced visual artifacts. In some cases, visual artifacts due to pixel non-uniform properties may be reduced or eliminated.

Indeed, this disclosure describes compensation techniques that rely at least in part on sensing an electrical parameter of a pixel that changes in response to light emitted from a self-emissive pixel, such as from a light-emitting diode (LED) of the pixel. This disclosure will refer to an LED of the pixel, but any suitable light-emitting element may be used. The pixel may be operated to emit light through via operating transistors to activate or deactivate. A transistor may be operated into a reverse-bias operational state during operation of the pixel by applying a voltage to the gate of the transistor to cause unidirectional current flow through the transistor similar to a diode. While the transistor is in the reverse-bias operational state, transistor photosensitivity increases. Thus, the photosensitive properties of the reverse-biased transistor may be leveraged to determine relative LED aging (e.g., through changes in currents generated in response to the LED light emission) and/or to compensate for non-uniform properties or portions of a display which manifest as non-uniform LED light emission.

To do this, a controller may operate to reverse-bias the transistor while operating the pixel to emit light according to image data. Before LED light emission, sensing circuitry may measure an electrical parameter of a pixel to determine an amount of current leakage of the pixel. After the controller operates to cause the pixel to emit light, the sensing circuitry may measure the electrical parameter again. The second electrical parameter measurement may correspond to the response of the photosensitive transistor to the LED light emission and the previously measured leakage current of the pixel. Based on these two measurements, processing circuitry may receive the two measurements to determine an amount the electrical parameter changed between the two measurements and leverage the amount of change to determine a sensed value of the electrical parameter indicative of the electrical parameter value generated in response to the light emission. The processing circuitry may use the value to determine how much light was emitted in response to the data used to drive the LED, an age of the LED, or the like. Furthermore, the processing circuitry may use the sensed value of the electrical parameter to determine an adjustment to compensate for any non-uniform LED aging and/or non-uniform component aging.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual embodiment, as in any engineering or design project, numerous embodiment-specific decisions are be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

This disclosure relates to compensation and detection of non-uniform light emission from pixels of an electronic display using optical feedback from inside the electronic display. Electronic displays are found in numerous electronic devices, from mobile phones to computers, televisions, automobile dashboards, and many more. Individual pixels of the electronic display may collectively produce images by permitting different amounts of light to be emitted from each pixel. This may occur by self-emission, as in the case of light-emitting diodes (LEDs), such as organic light-emitting diodes (OLEDs), or by selectively providing light from another light source, as in the case of a digital micromirror device or a liquid crystal display.

However, these electronic displays sometimes do not emit light equally between portions of between pixels of the electronic display, for example, due at least in part to pixel non-uniformity caused by differences in component age, operating temperatures, material properties of pixel components, and the like. The non-uniformity between pixels and/or portions of the electronic display may manifest as visual artifacts as different pixels or areas of the electronic display emit visibly different amounts of light.

Embodiments of the present disclosure relate to systems and methods for compensating non-uniform properties between pixels of an electronic display to improve perceived appearances of visual artifacts. Electronic displays include many light-modulating pixels, which may be self-emitting (e.g., as in the case of light-emitting diode (LEDs), such as organic light-emitting diodes (OLEDs)). While this disclosure generally refers to self-emissive displays, it should be appreciated that the systems and methods of this disclosure may also apply to other forms of electronic display that have non-uniform pixel properties causing non-uniform light emission or visual artifacts, and should not be understood to be limited to self-emissive displays. When the electronic display is a self-emissive display, an OLED represents one type of LED that may be found in a self-emissive pixel, but other types of LEDs may also be used.

The systems and methods of this disclosure may facilitate compensation of non-uniformities, or non-uniform properties, between pixels. This compensation may improve the visual appearance of images on an electronic display. This compensation may also improve a response by the electronic display to changes in LED performance due to component aging. These benefits are possible because these disclosed systems and methods enable sensing circuitry to accurately measure LED performance of individual pixels of the electronic display without relying on a photosensitive diode or other external sensing circuitry. In other words, processing circuitry via values measured with the sensing circuitry may leverage photosensitive properties of components implemented in the pixel circuitry to compensate for non-uniform properties, such as non-uniform LED aging (e.g., one LED aging faster relative to a second LED). This may improve sensing techniques in the field of electronic displays and pixel compensation techniques for electronic displays, since this measurement is performed through adjustments to transistor design or operation and without adding additional circuitry into the pixel to measure the light from each respective LED. The resulting images displayed on the electronic display, for example, the image resulting from an adjusted data signal based on the electrical parameter measurement, may have reduced or eliminated visual artifacts from non-uniform LED aging.

Figure 1:
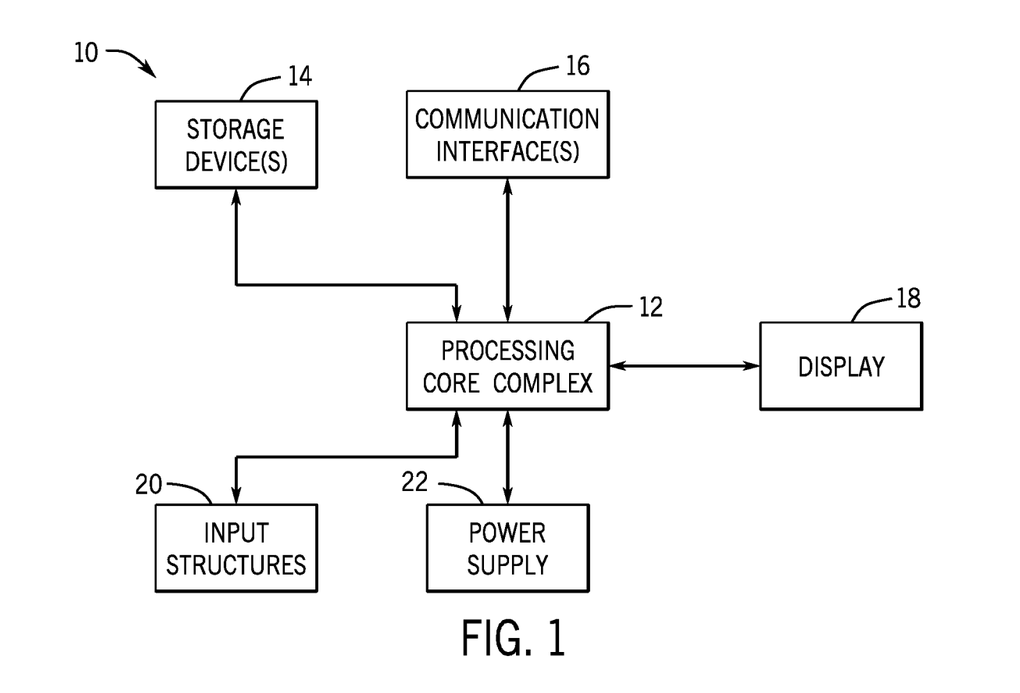
FIG. 1 is a schematic block diagram of an electronic device, in accordance with an embodiment.

A general description of suitable electronic devices that may include a self-emissive display, such as a LED (e.g., an OLED) display, and corresponding circuitry of this disclosure is provided. FIG. 1 shows one example of a suitable electronic device 10 which may include, among other things, a processing core complex 12 such as a system on a chip (SoC) and/or processing circuit(s), storage device(s) 14, communication interface(s) 16, a display 18, input structures 20, and a power supply 22. The blocks shown in FIG. 1 may each represent hardware, software, or a combination of both hardware and software. The electronic device 10 may include more or fewer elements. It should be appreciated that FIG. 1 merely provides one example of a particular implementation of the electronic device 10 but other valid embodiments also exist.

The processing core complex 12 or other data processing circuitry of the electronic device 10 may perform various data processing operations, including generating and/or processing image data for display on the display 18, in combination with the storage devices 14. For example, instructions that are executed by the processing core complex 12 or other data processing circuitry may be stored on the storage devices 14. The storage devices 14 may be volatile and/or non-volatile. By way of example, the storage device 14 may include random-access memory, read-only memory, flash memory, a hard drive, and so forth. In this way, the processing core complex 12, or other suitable processing circuitry, in combination with the storage devices 14 (e.g., to store values associated with calculation), may receive measured pixel parameters associated with one or more data signals and, based on the measured pixel parameter, determine how to adjust a data signal to be transmitted to a pixel to facilitate compensating for non-uniform properties of that pixel.

The electronic device 10 may use the communication interface 16 to communicate with various other electronic devices or elements. The communication interface 16 may include input/output (I/O) interfaces and/or network interfaces. Such network interfaces may include those for a personal area network (PAN) such as Bluetooth, a local area network (LAN) or wireless local area network (WLAN) such as Wi-Fi, and/or for a wide area network (WAN) such as a cellular network.

Using pixels containing LEDs (e.g., OLEDs), the display 18 may show images generated by the processing core complex 12 or other data processing circuitry. The display 18 may include touchscreen functionality for users to interact with a user interface appearing on the display 18. Input structures 20 may also enable a user to interact with the electronic device 10. In some examples, the input structures 20 may represent hardware buttons, which may include volume buttons or a hardware keypad. The power supply 22 may include any suitable source of power for the electronic device 10. This may include a battery within the electronic device 10 and/or a power conversion device to accept alternating current (AC) power from a power outlet.

Figure 2:
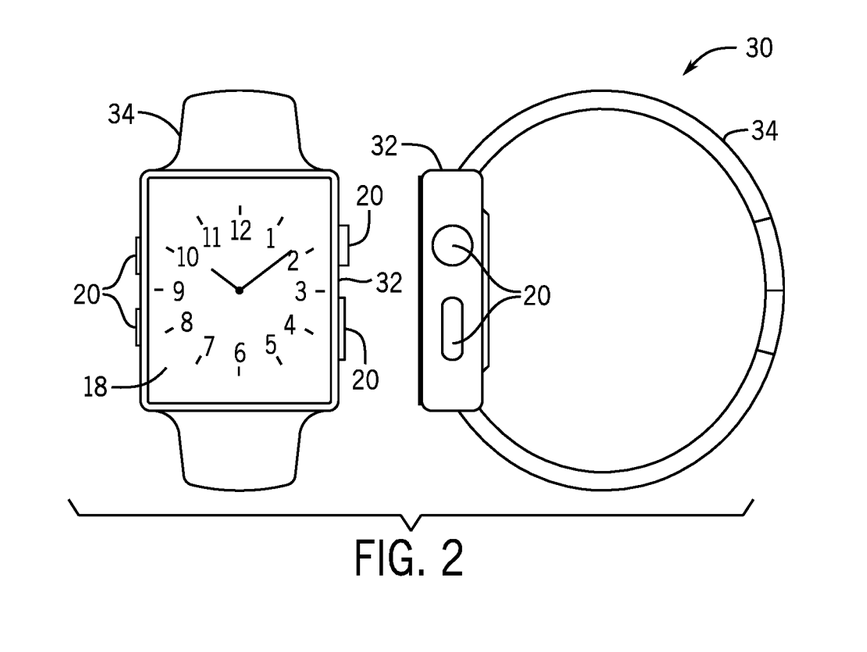
FIG. 2 is a perspective view of a fitness band representing an embodiment of the electronic device of FIG. 1, in accordance with an embodiment.

As may be appreciated, the electronic device 10 may take a number of different forms. As shown in FIG. 2, the electronic device 10 may take the form of a watch 30. For illustrative purposes, the watch 30 may be any Apple Watch® model available from Apple Inc. The watch 30 may include an enclosure 32 that houses the electronic device 10 elements of the watch 30. A strap 34 may enable the watch 30 to be worn on the arm or wrist. The display 18 may present information related to the watch 30 operation, such as the time. Input structures 20 may enable a person wearing the watch 30 to navigate a graphical user interface (GUI) on the display 18.

Figure 3:
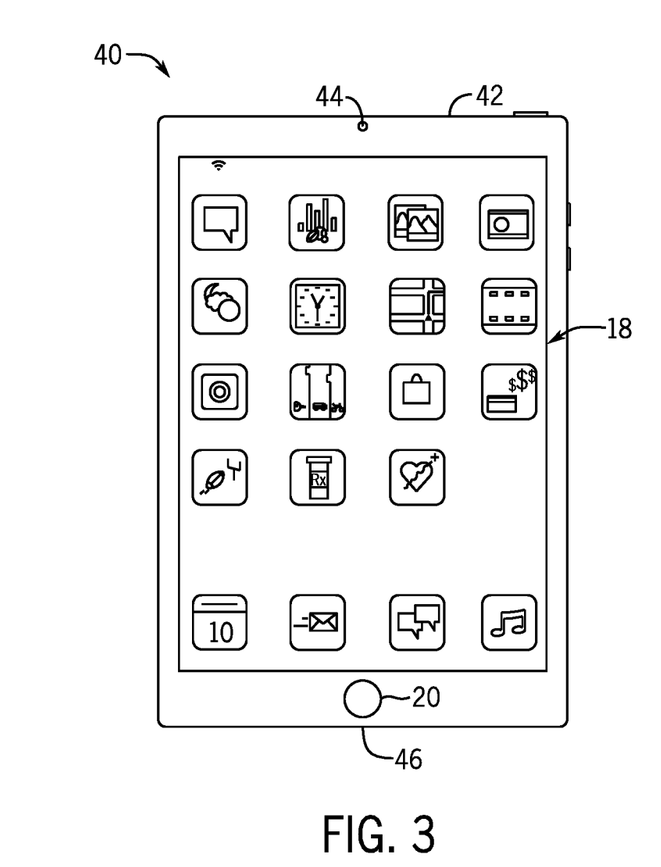
FIG. 3 is a front view of a slate representing an embodiment of the electronic device of FIG. 1, in accordance with an embodiment.

The electronic device 10 may also take the form of a tablet device 40, as is shown in FIG. 3. For illustrative purposes, the tablet device 40 may be any iPad® model available from Apple Inc. Depending on the size of the tablet device 40, the tablet device 40 may serve as a handheld device such as a mobile phone. The tablet device 40 includes an enclosure 42 through which input structures 20 may protrude. In certain examples, the input structures 20 may include a hardware keypad (not shown). The enclosure 42 also holds the display 18. The input structures 20 may enable a user to interact with a GUI of the tablet device 40. For example, the input structures 20 may enable a user to type a Rich Communication Service (RCS) message, a Short Message Service (SMS) message, make a telephone call, or the like. A speaker 44 may output a received audio signal and a microphone 46 may capture the voice of the user. The tablet device 40 may also include a communication interface 16 to enable the tablet device 40 to connect via a wired connection to another electronic device.

Figure 4:
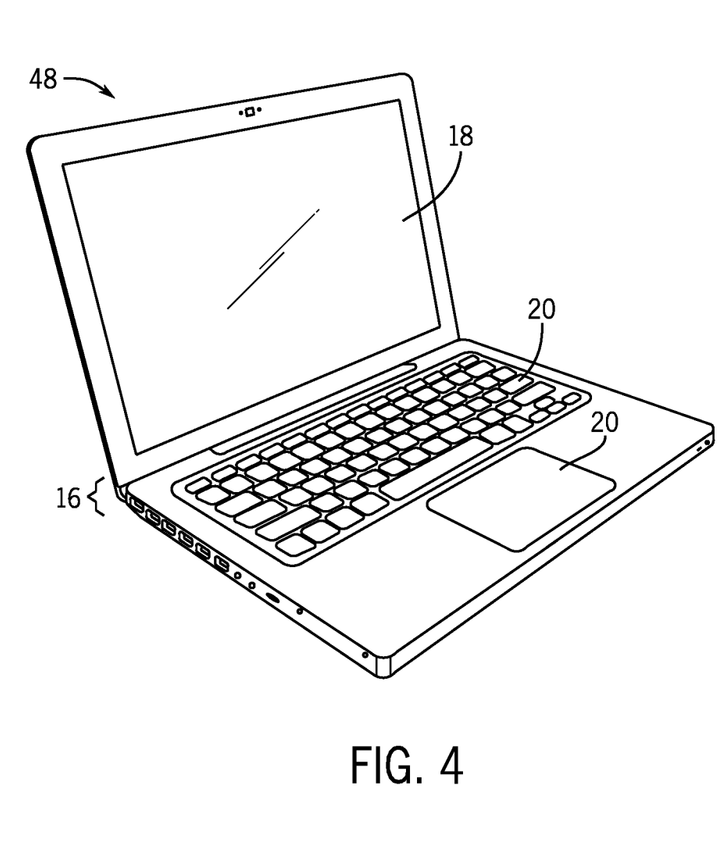
FIG. 4 is a front view of a notebook computer representing an embodiment of the electronic device of FIG. 1, in accordance with an embodiment.

A computer 48 represents another form that the electronic device 10 may take, as is shown in FIG. 4. For illustrative purposes, the computer 48 may be any Macbook® or iMac® model available from Apple Inc. It should be appreciated that the electronic device 10 may also take the form of any other computer, including a desktop computer. The computer 48 shown in FIG. 4 includes the display 18 and input structures 20, such as in the form of a keyboard and a track pad. Communication interfaces 16 of the computer 48 may include, for example, a universal service bus (USB) connection.

Figure 5:
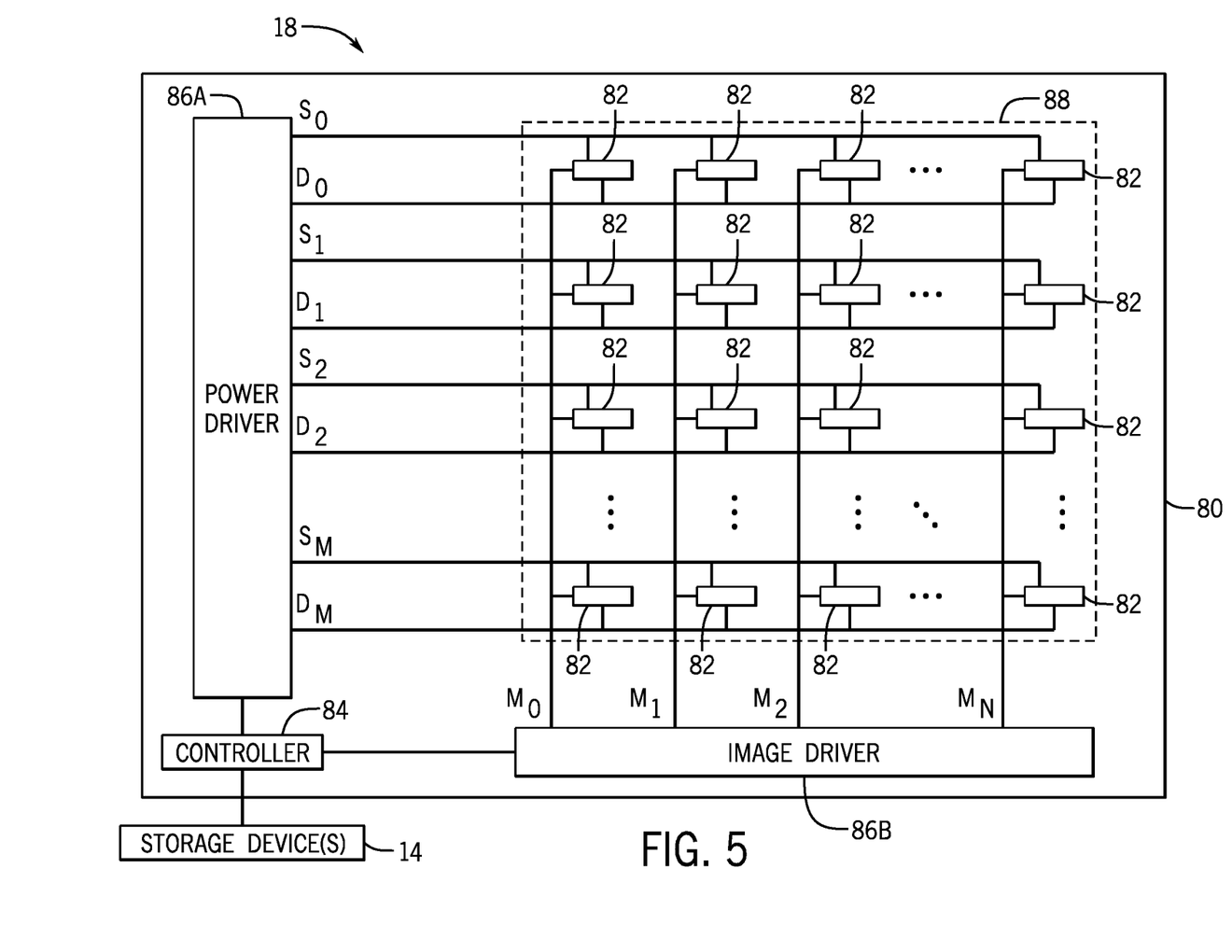
FIG. 5 is a circuit diagram of the display of the electronic device of FIG. 1, in accordance with an embodiment.

As shown in FIG. 5, the display 18 may include a pixel array 80 having an array of one or more pixels 82. The display 18 may include any suitable circuitry to drive the pixels 82. In the example of FIG. 5, the display 18 includes a controller 84, a power driver 86A, an image driver 86B, and the array of the pixels 82 within an active area 88 of the display 18. The power driver 86A and image driver 86B may drive individual pixels 82 disposed within the active area 88 through transmission of one or more data signals, or signals generated based at least in part on data signals, for example, a control signal generated to match a particular frequency initially defined by a data signal. In some embodiments, the power driver 86A and the image driver 86B may include multiple channels for independent driving of multiple pixels 82. Each of the pixels 82 may include any suitable light emitting element, such as a LED, one example of which is an OLED. However, any other suitable type of pixel may also be used. Although the controller 84 is shown in the display 18, the controller 84 may be located outside of the display 18 in some embodiments. For example, the controller 84 may be located in the processing core complex 12 or other data processing circuitry.

The scan lines S0, S1, . . . , and Sm and driving lines D0, D1, . . . , and Dm may connect the power driver 86A to the pixel 82. The pixel 82 may receive on/off instructions through the scan lines S0, S1, . . . , and Sm and may generate electrical signals corresponding to data signals transmitted from the driving lines D0, D1, . . . , and Dm. The data signals may be transmitted to each of the pixels 82 to emit light according to instructions from the image driver 86B through driving lines M0, M1, . . . , and Mn. Both the power driver 86A and the image driver 86B may transmit data signals at programmed voltage levels through respective driving lines to operate each pixel 82 at a state determined by the controller 84 to emit light. Each driver may supply data signals at a duty cycle and/or an amplitude sufficient to operate each pixel 82.

The intensities of each of the pixels 82 may be defined by corresponding image data that defines particular gray levels for each of the pixels 82 to emit light. A gray level indicates a value between a minimum and a maximum range, for example, 0 to 255, corresponding to a minimum and maximum range of light emission. Causing the pixels 82 to emit light according to the different gray levels causes an image to appear on the display 18. In this way, a first brightness of light (e.g., at a first luminosity and defined by a gray level) may emit from a pixel 82 in response to a first value of the image data and the pixel 82 may emit a second brightness of light (e.g., at a first luminosity) in response to a second value of the image data. Thus, image data may create a perceivable image output through indicating light intensities to apply to individual pixels 82.

The controller 84 may retrieve image data indicative of light intensities for the colored light outputs for the pixels 82 from the storage devices 14. In some embodiments, the processing core complex 12 or other data processing circuitry may provide image data, data signals, or adjusted data signals, directly to the controller 84. The controller 84 may control the pixel 82 through control signals transmitted to controllable elements of the pixel 82 and may operate the driver 86 in response to adjusted data signals to compensate for pixel non-uniformities. It is noted that these data signals may be directly transmitted by the controller 84 to the drivers 86 for transmission to the pixels 82, or the data signals may be further processed and signals derived from the data signals may be transmitted to the drivers 86. Compensations for non-uniform properties between pixels 82 are useful since without compensation, the data signal may not convey the correct image data, but with compensation the data signal may convey the correct image data. The pixel 82 may include any suitable controllable element, such as a transistor, one example of which is a metal-oxide-semiconductor field-effect transistor (MOSFET). However, any other suitable type of controllable elements, including thin film transistors (TFTs), p-type and/or n-type MOSFETs, and other transistor types, may also be used.

Figure 6:
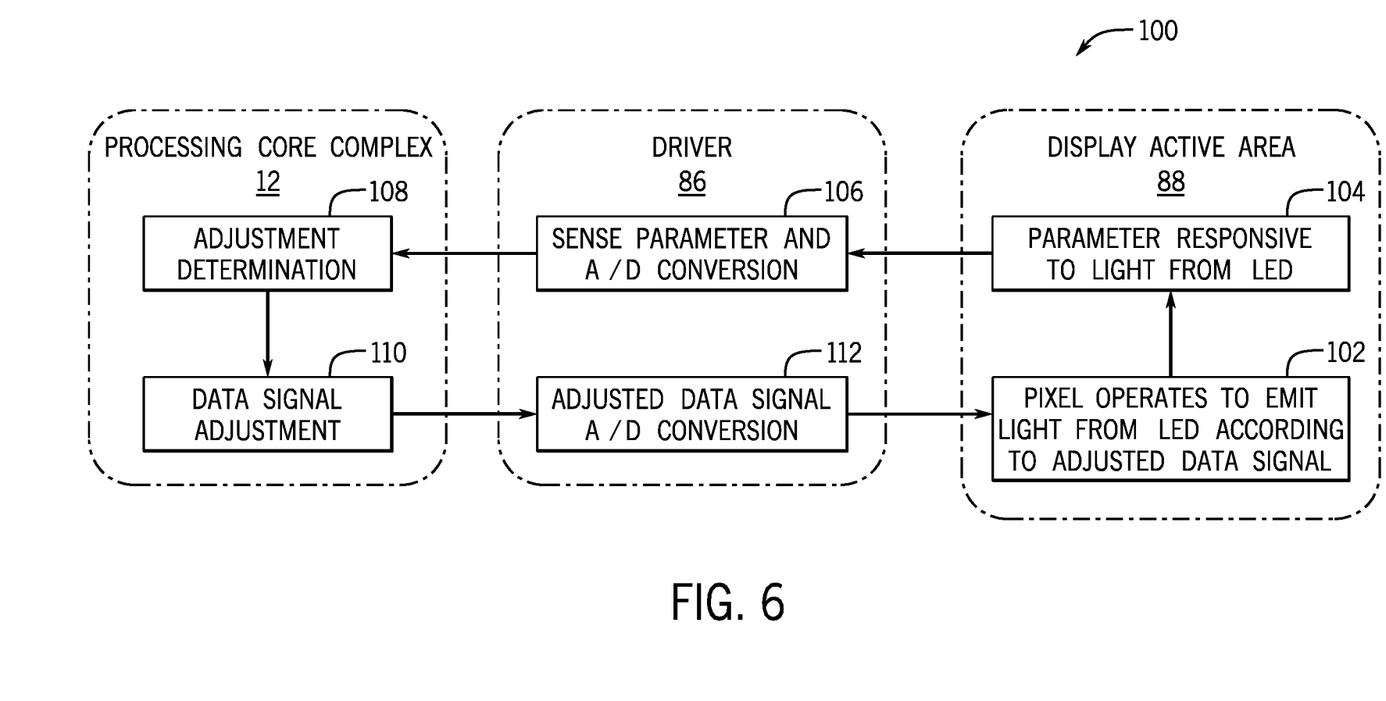
FIG. 6 is a block diagram of a process to leverage photosensitive properties of pixel components to determine an adjustment to apply to the display of FIG. 5, in accordance with an embodiment.

FIG. 6 illustrates a block diagram of a generalized process 100 to leverage photosensitive properties of transistors to determine an adjustment to apply to the display 18. The process 100 may be performed during normal pixel 82 operation for displaying images on the display 18. Thus, starting at block 102, a pixel 82 within an active area 88 of a display 18 may operate to emit light to facilitate displaying an image on the display 18. While being operated to display the image, certain transistors may be operated into a reverse-bias operational state to stop undesired electrical signals, undesired data signals, and/or residual signals from altering the display of the image. While in the reverse-bias operational state, a transistor (e.g., a transistor with a partially thin anode) may be sensitive to light emitted by an LED of the pixel 82 during the display of the image and thus may be considered a photosensitive transistor while in this reverse-bias operational state.

Continuing on to block 104, the photosensitive transistor may cause, at least in part, a change in a pixel parameter value (e.g., a current value, a voltage value) associated with the pixel 82 in response to a change in the LED light emission, for example, a change in a current transmitted from the photosensitive transistor. In this way, measuring a change in the pixel parameter before LED light emission and during the LED light emission may facilitate determining a contribution to the pixel parameter caused by the LED light emission, and thus may be used to determine and compensate for LED non-uniformities. As an example, the pixel parameter sensed may be a voltage generated in response to currents caused by the LED light emission, thus the change in voltage from before and during light emission may be used to determine the contribution to the voltage value from the LED light emission.

In this way, at block 106, the pixel parameter that changes in response to the sensing transistor detecting light is measured by sensing circuitry. The pixel parameter value may be converted from an analog value into a digital value for processing by the processing core complex 12 or other data processing circuitry. A driver 86 of the display 18 (e.g., power driver 86A, image driver 86B, or any combination thereof) may include the sensing circuitry. After sensing, the sensing circuitry 184 transmits the sensed parameter, or an indication of the sensed parameter value, to the processing core complex 12 or other data processing circuitry for continued analysis. It should be understood that while depicted as a single element, the processing core complex 12 or other data processing circuitry may work cooperatively with, or be replaced by, controller 84 or other suitable processing circuitry to perform the adjustments to the data signals transmitted to the pixel 82 for the purposes of non-uniformity correction. However, for ease of discussion, the processing core complex 12 or other data processing circuitry is discussed herein as determining and performing the adjustments.

At block 108, the processing core complex 12 or other data processing circuitry receives a first value representing the pixel parameter before the LED light emission and a second value representing the pixel parameter during the LED light emission. Using these two values, the processing core complex 12 or other data processing circuitry may determine the change in the pixel parameter value due to the LED light emission (e.g., $V_{sensed}$ from LED light emission=second value−first value, as is described below). Based on the pixel parameter value caused by the LED light emission, the processing core complex 12 or other data processing circuitry may determine an adjustment to make to the pixel 82 to compensate for the differences between the value of the pixel parameter and an additional value of the pixel parameter. In this way, the processing core complex 12 or other data processing circuitry may compensate for non-uniformities between pixels 82 (e.g., differences in age between pixels, differences in components or material properties between pixels) or between measurements of the same pixel 82 (e.g., to determine rate of aging for a pixel caused by aging of LED or component deterioration over time). The processing core complex 12 or other data processing circuitry may determine the adjustment in a variety of ways, including referencing a look-up table, inputting the pixel parameter value into a determined equation, performing adjustments based on the pixel parameter value and a spatial location of the pixel on the display 18, or the like. In one embodiment, the pixel parameter value is compared to a set point pixel parameter value stored in a look-up table accessible by the controller 84 and, based on the difference between the pixel parameter value and the set point pixel parameter value, the processing core complex 12 or other data processing circuitry determines an adjustment to make to the data signal transmitted to the pixel 82.

After determining the adjustment, at block 110, the processing core complex 12 or other data processing circuitry may perform the determined adjustment to the data signal (e.g., increase or decrease data signal value) to be transmitted to the pixel 82 to compensate for non-uniformities. At block 112, the processing core complex 12 or other data processing circuitry may transmit the adjusted data signal (e.g., directly or via communication with the controller 84) to the driver 86 for digital-to-analog conversion or for other pre-processing before the adjusted data signal is used to drive the pixel 82. After pre-processing, the adjusted data signal is transmitted to the pixel 82 to cause light emission. By driving the pixel 82 with the adjusted data signal, the pixel 82 may eliminate or reduce the display 18 non-uniformities caused by LED differences between pixels 82.

Figure 7:
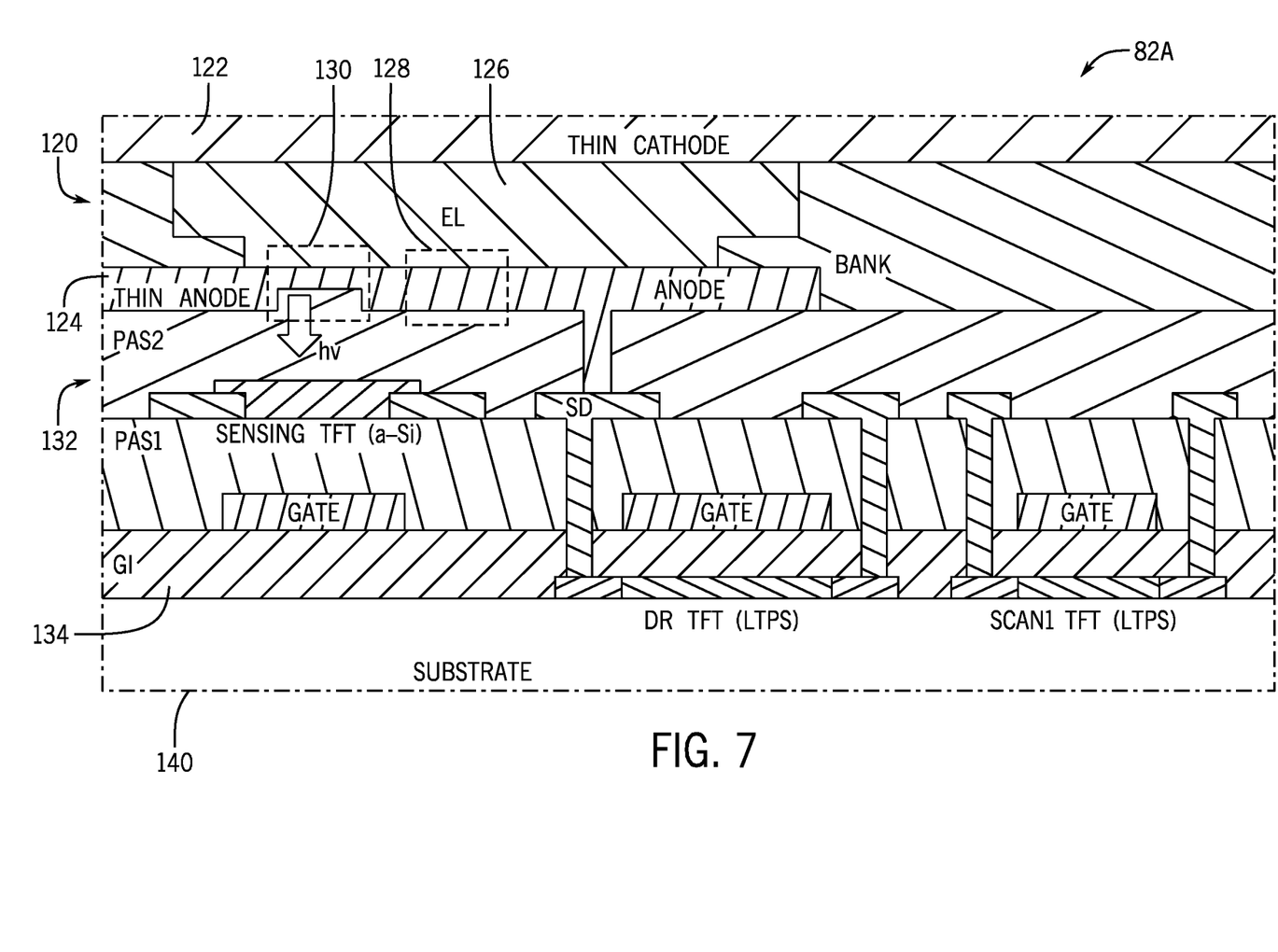
FIG. 7 is an illustration of a side view of a substrate with pixel circuitry disposed on a substrate, in accordance with an embodiment.

To help explain the light-sensitive properties of a transistor operated in a reverse-bias operational state, FIG. 7 is a side view of a stacked integrated circuit. This stacked integrated circuit is an example of the pixel 82, pixel 82A. The pixel 82A includes a LED 120 having a cathode 122, an anode 124, and an electroluminescent material 126. The anode 124 has a variable thickness, where the anode 124 is thicker at a first portion 128 than at a second portion 130, and is made of a conductive material, such as aluminum. For example, the first portion may be between 50 μm to 150 μm thick and the second portion may be 5 μm to 15 μm thick, however any suitable thickness may be used for each portion as long as the second portion 130 is thin enough to appear transparent or to be substantially transparent (e.g., permits light to emit through the anode 124 at the second portion 130 while not permitting light to emit through the anode 124 at the first portion 128 while retaining conductive properties (e.g., thick enough to be conductive). The difference in widths may cause the first portion 128 to have a light transmissivity value greater than a light transmissivity value of the second portion 130, where light transmissivity generally indicates the degree to which a particular physical medium permits light to transmit through itself and may correspond to transparency in some physical mediums. Because of the difference in widths, when the LED 120 is operated to emit light, a sensing transistor 132 in a reverse-bias operational state (e.g., via a negative voltage transmitted on gate line 134) may respond to the change in light emitted through the thinner second portion 130 of the anode. This photosensitive sensing transistor 132 generates a current (e.g., an electrical signal) as optical feedback in response to an increase in light received through the second portion 130 of the anode 124.

The sensing transistor 132 may be formed of amorphous silicon (a-Si) or polycrystalline silicon (poly-Si), such as a low-temperature polycrystalline silicon (LTPS). As depicted, the sensing transistor 132 is formed directly below the second portion 130 of the anode 124, such that there is no opaque intervening layer between the sensing transistor 132 and the second portion of the anode 124 that may stop light from reaching the sensing transistor 132. A transistor formed of a-Si and operated in the reverse-bias operational state may be sensitive to changes in light (hv) emitted from an LED 120 and thus may be used to detect changes in light emission; thus, the sensing transistor 132 may detect changes in light emission. While in the reverse-bias operational state, the sensing transistor 132 is sensitive to all wavelengths of the light spectrum, thus a single modification to transistor design (e.g., the thin second portion 130 of the anode 124) may be sufficient to detect LED light emission of any channel.

The sensing transistor 132 may be operated into the reverse-bias operational state by applying a sufficiently reverse (e.g., sufficiently negative, when the sensing transistor is an N-channel transistor, or sufficiently positive, when the sensing transistor is a P-channel transistor) voltage to the gate terminal. For example, if the sensing transistor 132 is activated using a high logic signal (e.g., a positive voltage), the sensing transistor 132 is operated in the reverse-bias operational state by applying a voltage smaller than (e.g., negative) low logic signal applied to deactivate the sensing transistor 132.

Figure 8:
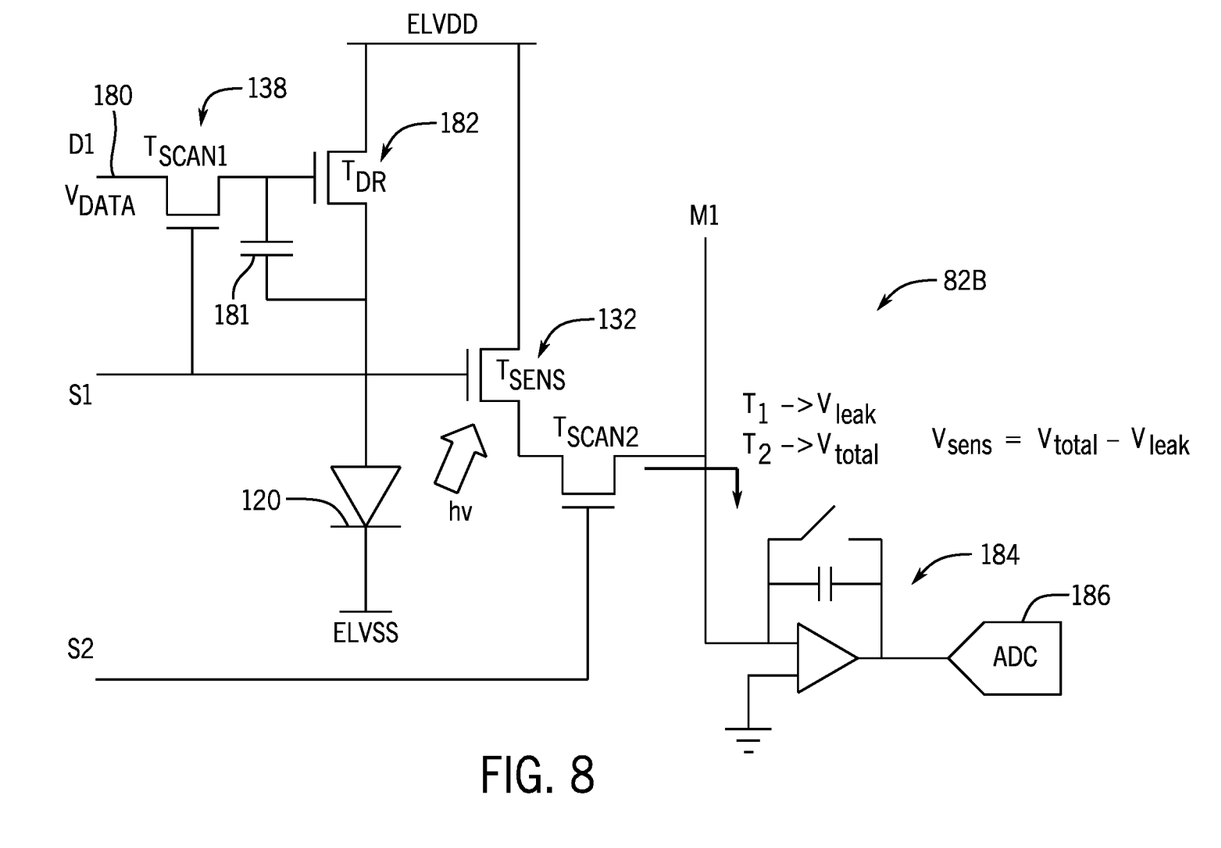
FIG. 8 is a circuit diagram of an example of the pixel circuitry of FIG. 7 used to determine a relative amount of light emitted by a light-emitting diode (LED), in accordance with an embodiment.

FIG. 8 illustrates a second example of the pixel 82B. The pixel 82B may include a terminal 180 to receive a data signal (e.g., Vdata) generated based at least in part on image data to be displayed. The controller 84 may use the data signal in conjunction with control signals (e.g., signal transmitted via line S1) transmitted to controllable elements of the pixel 82B to control the light emitted from the pixel 82B. The data signal corresponds to the luminosity at which the light-emitting diode (LED) 120 is operated to emit light. The data signal transmitted to the pixel 82B may charge a capacitor 181 for use in operating the LED 120 to emit light. The controller 84 may control the transmission of the data signal through activation of a transistor ($T_{SCAN1}$) 138 via a control signal transmitted on the scan line S1. Thus, the processing core complex 12 or other data processing circuitry may change the light emitted from the LED 120 by changing the characteristics (e.g., value, amplitude) of the data signal applied to the pixel 82B.

Driving circuitry, such as driving transistor 182 and the capacitor 181, may facilitate changing the light emitted from the LED 120 because the driving circuitry generates a driving current based at least in part on the value of the data signal and material properties of circuit components (e.g., resistances). In this way, a perceivable change in light emitted from the LED 120 (e.g., decrease or increase in brightness or luminosity) may be caused by either the change in value of the data signal or changes in properties of the circuit components.

As described above, due at least in part on the material properties of the LED 120, a perceived brightness between two or more pixels 82B may appear non-uniform—meaning that one pixel 82B may appear as brighter than a different pixel 82B even when both are programmed with the same data signal. The processing core complex 12 or other data processing circuitry, may compensate for non-uniform properties based on differences in light emitted by two different LEDs 120 or the differences in light emitted between a programmed data signal of the same LED 120 at different times.

To make this determination, sensing circuitry 184 may be operated to measure a pixel parameter, such as a voltage, generated in response to currents transmitted from the optical feedback of the photosensitive sensing transistor 132. As described above, this current is transmitted in part due to leakage currents of the pixel 82B and in part due to current generated as optical feedback in response to light (hv) emitted from the LED 120. Thus, to distinguish between the two current values, two measurements may be made during the same display cycle. The first measurement is taken at a first time ($T_1$), may indicate a voltage value ($V_{leak}$) from pixel 82B leakage currents. This first time may occur while the transistor 138 is in the reverse-bias operational state, such as during an initial programming stage (e.g., while the data signal is initially transmitted to the pixel 82B and before a control signal activates the transistor 138). The second measurement is taken at a second time ($T_2$), may indicate a voltage value ($V_{total}$) for the current contribution from leakage currents plus a current contribution caused by light emission. This second time may occur after the data signal is applied to the pixel 82B and the pixel 82B is operated to emit light. However, it should be understood that, in some embodiments, the second measurement may occur at a time before the first measurement; in these embodiments, regardless of the order in which they are collected, these measurements may be used to identify an amount of light that is being emitted.

These voltages may be respectively transmitted through an analog-to-digital converter 186 and transmitted to the processing core complex 12 or other data processing circuitry after conversion. The processing core complex 12 or other data processing circuitry may use the two measurements to determine the actual voltage value associated with the light emission ($V_{sens} = V_{total} - V_{leak}$). This sensed electrical parameter ($V_{sens}$) may be used to determine an adjustment to make to the data signal to compensate for non-uniform properties between LEDs 120.

Figure 9:
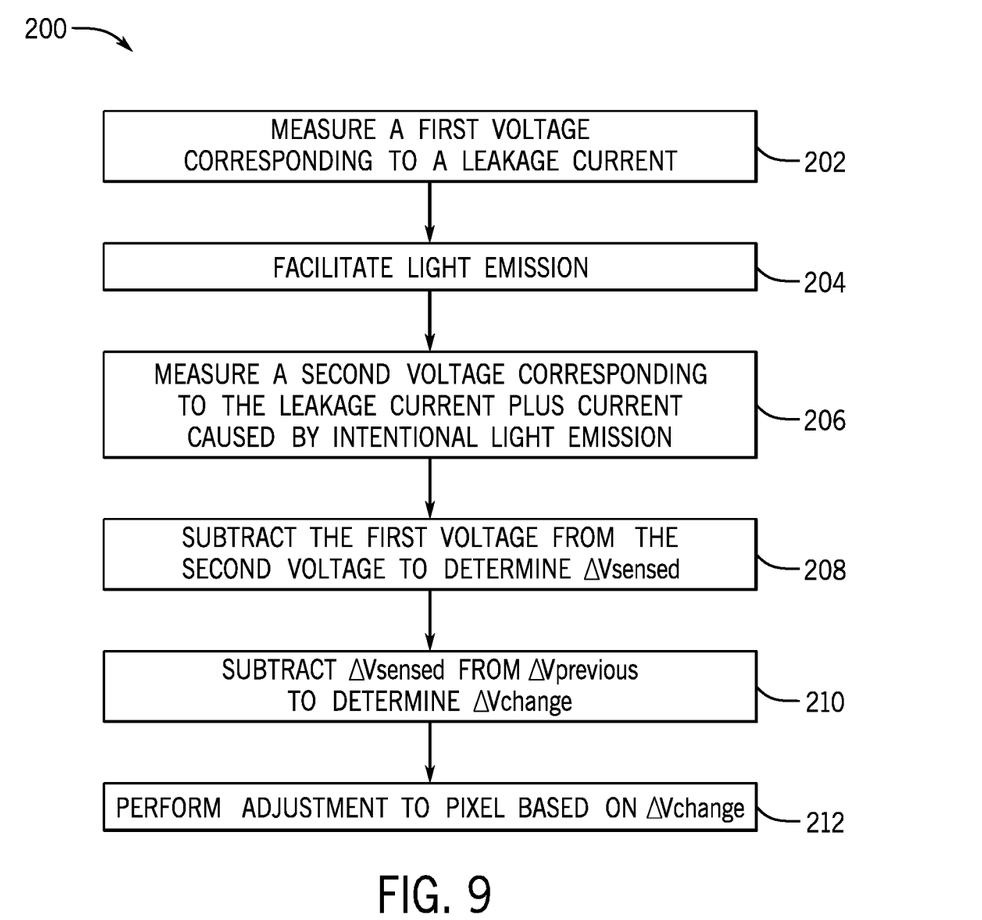
FIG. 9 is a diagram of a process to sense electrical parameters and adjust data signals provided to the display of FIG. 5 in response to the sensed electrical parameters, in accordance with an embodiment.

FIG. 9 is a flowchart of a process 200 for performing the measurements using a photosensitive sensing transistor 132 that the processing core complex 12 or other data processing circuitry may follow in operating to compensate non-uniform properties of pixels 82. The process 200 of FIG. 9 may include measuring a first voltage corresponding to a leakage current (block 202), facilitating light emission (block 204), measuring a second voltage corresponding to the leak current plus current caused by intentional light emission (block 206), subtracting the first voltage from the second voltage to determine the change in sensed voltages (block 208), subtracting the change in the sensed voltages from a previous change in sensed voltages to determine a difference between the changes of the sensed voltages (block 210), and performing an adjustment to the pixel based on the difference (block 212). It should be understood that although the processing core complex 12 or other data processing circuitry and the controller 84 are described as performing the process 200, any suitable processor and/or controller, or all or part of the processing core complex 12 or other data processing circuitry, may perform all or part of the process 200 in any portion or component of the electronic device 10.

At block 202, the controller 84 may operate the sensing circuitry 184 to measure a first voltage corresponding to a leakage current of the pixel 82. This measurement may occur before a data signal transmitted to the pixel 82 is used to cause light emission. In this way, the first voltage generally represents the baseline current of the pixel 82 that transmits from the sensing transistor 132 (e.g., leakage currents) without including currents caused by the light emission. As a reminder, during light emission, the photosensitive sensing transistor 132 generates current as optical feedback in response to light received by the sensing transistor 132. In this way, a baseline first voltage measurement may be used to determine how much of the total voltage sensed during light emission is actually from the light emission. The first voltage measurement may be transmitted an analog-to-digital converter 186 for conversion and is eventually transmitted to the processing core complex 12 or other data processing circuitry.

After measuring the first voltage, at block 204, the controller 84 may facilitate light emission, such as through enabling an emission control signal. Different examples of pixels 82 may be operated by the controller 84 to emit light through different control schemes. For example, the pixel 82B may emit light upon the capacitor 181 charging after the controller 84 activates the transistor 138.

While light emission is occurring, at block 206, the controller 84 may operate the sensing circuitry 184 to measure a second voltage corresponding to the leaking current and current generated by the sensing transistor 132 in response to the light emission. To do so, the controller 84 may operate the sensing transistor 132 into the reverse-bias operational state such that the sensing transistor 132 becomes photosensitive. As described earlier, the controller 84 may enable a control signal applied to a gate of the sensing transistor 132, where the control signal has a low voltage value suitable to operate the sensing transistor 132 into the reverse-bias operational state (e.g., a negative voltage). The second voltage measurement may be transmitted to an analog-digital converter 186 for conversion and is eventually transmitted to the processing core complex 12 or other data processing circuitry for determination of the adjustment.

After measuring the second voltage, at block 208, the processing core complex 12 or other data processing circuitry may subtract the first voltage measurement from the second voltage measurement to determine a sensed voltage value caused by the LED 120 light emission ($\Delta V_{sensed}$). This sensed voltage value represents the voltage generated in response to the LED 120 light emission. In this way, for example, as the LED 120 or the pixel 82 ages, the sensed voltage value may adjust. Thus, monitoring the sensed voltage value may be a reliable method to track LED 120 aging and/or pixel 82 performance in general.

At block 210, the processing core complex 12 or other data processing circuitry may use the sensed voltage value and a second sensed voltage value from a most recently determined sensed voltage value ($\Delta V_{previous}$) to determine a change in voltage between the two display cycles ($\Delta V_{change}$). As a reminder, this measurement method may be used to determine non-uniform properties between multiple pixels 82, or between display cycles of the same pixel. The processing core complex 12 or other data processing circuitry may subtract the sensed voltage value from the most recently determined sense voltage value to determine a change in voltage between the two display cycles ($\Delta V_{change}$).

After determining the change in voltage values between the two display cycles ($\Delta V_{change}$), at block 212, the processing core complex 12 or other data processing circuitry may perform an adjustment based on the change in voltage value. This adjustment may correct, or compensate for, the non-uniform properties between pixels 82 of the display 18. Thus, the determination of the adjustment may rely on electrical parameters of one or more pixels 82 or on one or more measured voltages of the one or more pixels 82. For example, the processing core complex 12 or other data processing circuitry may adjust a value of the data signal to be transmitted to the pixel 82 to convey the desired image data through light emission. In this way, the adjustment may include adjusting a voltage transmitted to the pixel 82, changing a control signal transmitted to the pixel 82, changing a frequency or other signal property of the voltage and/or the control signal transmitted to the pixel 82, or the like. Ultimately, the processing core complex 12 or other data processing circuitry transmits the adjusted data signal to the controller 84 to cause adjusted operation of the pixel 82.

Figure 10:
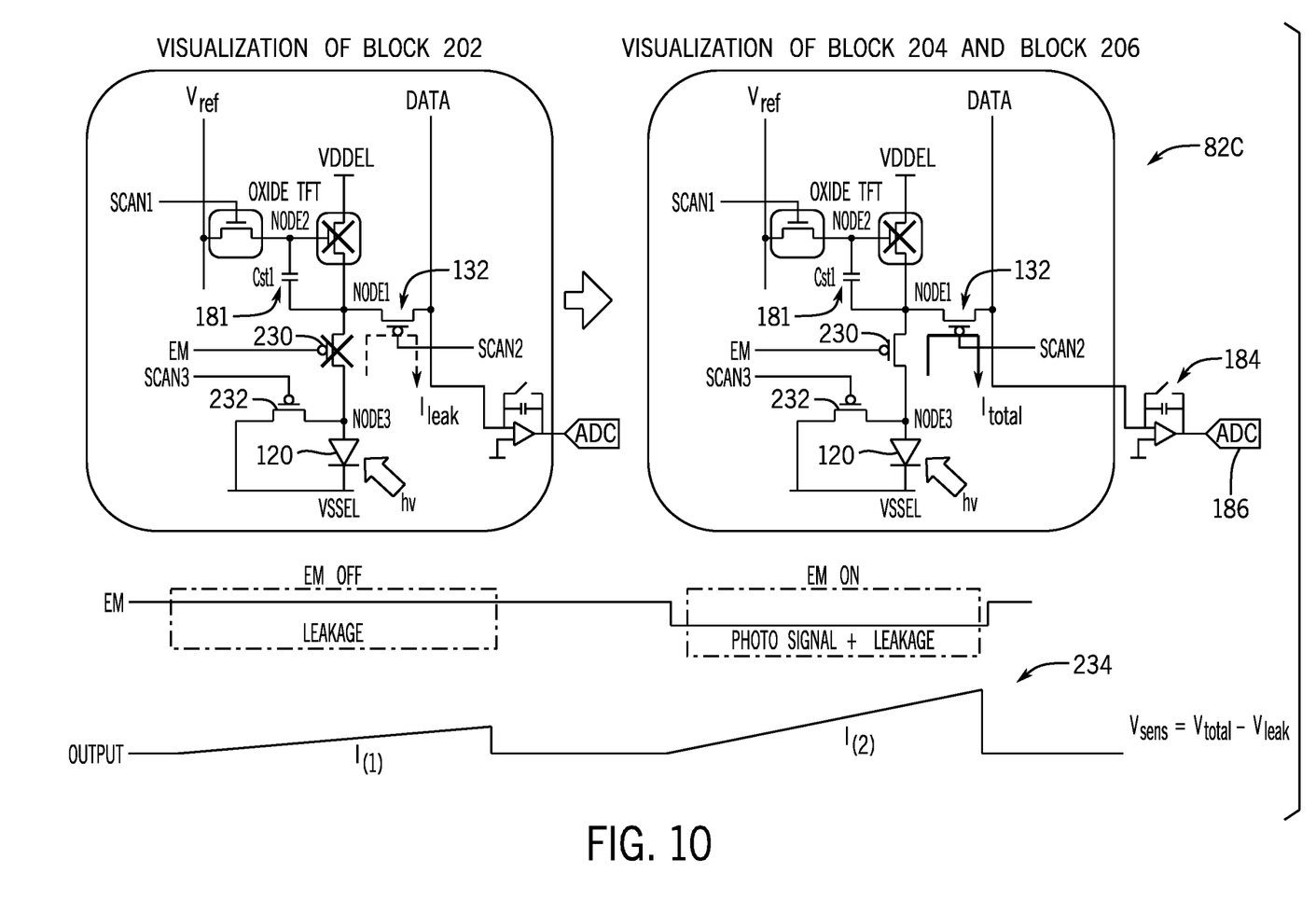
FIG. 10 is a circuit diagram showing how the process of FIG. 9 is implemented using an example of the pixel circuitry of FIG. 7 and the effect on a current output, in accordance with an embodiment.

FIG. 10 depicts a third example of the pixel 82, depicted as pixel 82C. In the pixel 82C, emission is controlled through the activation of an emission transistor 230. Using the process 200 to explain operation of the pixel 82C, at the block 202, the controller 84 may disable an emission control signal (EM) and enable scan control signals (Scan3 and Scan1) to measure the first voltage ($V_{leak}$). This control sequence may cause the pixel 82C to not emit light according to a data signal and may divert residual currents to ground or a common reference voltage (VSSEL) through a draining transistor 232. The controller 84 may also operate the power driver 86A to program the capacitor 181 with the data signal by enabling two scan control signals (Scan1, Scan2). While at this stage, the controller 84 may operate the sensing circuitry 184 to measure the first voltage indicative of leakage current ($I_{leak}$) present in the pixel 82C while light emission is not occurring. The controller 84 may operate the sensing circuitry 184 to measure the value of the first voltage for transmission to the processing core complex 12 or other data processing circuitry.

Upon programming the capacitor 181, at block 204, the controller 84 may apply a control signal (Scan2) of suitable value to operate the sensing transistor 132 into a reverse-bias operational state. Operating the sensing transistor 132 into a reverse-bias operational state may stop undesired electrical signals or untimely data signals from affecting light emission of the LED 120, such as data signals for a next display cycle. To facilitate light emission, after operating the sensing transistor 132 into the reverse-bias operational state, the controller 84 may enable a control signal (EM) to activate the emission transistor 230.

After activating the emission transistor 230, at block 206, the LED 120 may emit light and the sensing transistor 132 may generate current ($I_{total}$) in response to the light emission (e.g., due to responding to light received through the thin anode 124 at the second portion 130). The current ($I_{total}$) represents the leakage current of the pixel 82 and the current contribution from the sensitivity to light emission of the sensing transistor 132. Inset graph 234 depicts the contribution to the current ($I_{total}$) based on the portion from leakage and the portion from light emission (e.g., optical feedback generated). The controller 84 may operate the sensing circuitry 184 to measure the voltage value ($V_{total}$) corresponding to the current ($I_{total}$) to determine the change in value caused by the light emission. After measurement of the voltage value ($V_{total}$), the processing core complex 12 or other data processing circuitry receives the measurements at blocks 208-212 and determines the contribution to the voltage by light emission of the LED 120. The processing core complex 12 or other data processing circuitry determines an adjustment based at least in part on the contribution.

In some embodiments, after determining the change of voltage ($\Delta V_{change}$) value, the processing core complex 12 or other data processing circuitry may store the voltage value into one or more storage devices 14 for processing, or future access, or for additional determinations of adjustments. This may involve the processing core complex 12 or other data processing circuitry storing the voltage value into an accessible storage device 14 location. In addition, in some embodiments, the adjustment determined by the processing core complex 12 or other data processing circuitry may be a global adjustment, a regional adjustment, a singular adjustment, or any combination thereof. In this way, an entire region or subset of pixels 82 of the active area 88 may be globally adjusted to compensate for a common, or similar, non-uniformity and in addition to the global adjustment, a data signal to a single pixel 82 (or an additional subset of pixels, such as a whole row and/or column of pixels 82) may be adjusted to further compensate for a unique or relatively individual non-uniformity for that pixel 82 (or additional subset of pixels).

Thus, the technical effects of the present disclosure include improvements to electronic displays to compensate for non-uniform pixel properties, for example, through monitoring aging of an LED via measuring changes in current generated in response to light emission of the LED and using the measurements to perform adjustments to pixel operation to compensate for any non-uniform aging. These techniques describe selectively adjusting data signals used to drive a pixel to emit light at a particular brightness of light to account for specific aspects of that pixel that differ from other pixels based on LED aging and LED light emission. These techniques describe an improved manner to detect LED aging without relying on additional or external optical sensing equipment, components, or circuitry to make the measurements by using elements already included in display pixels (e.g., transistor in the reverse-bias operational state and being used, while in the reverse-bias operational state, to determine properties associated with LED light emission).

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
 a photosensitive transistor;
 a light-emitting diode configured to be electrically separated from the photosensitive transistor, wherein the light-emitting diode comprises an anode, and wherein the anode comprises:
  a first portion having a first thickness; and
  a second portion having a second thickness, wherein the second portion of the anode is disposed above a gate of the photosensitive transistor, and wherein the second thickness is less than the first thickness to enable more light to pass through the second portion to reach the photosensitive transistor; and
 driving circuitry configured to receive a data signal, wherein the driving circuitry is configured to cause light emission from the light-emitting diode in response to the data signal, and wherein the photosensitive transistor configured to generate optical feedback in response to light emitted from the light-emitting diode during the light emission.

2. The device of claim 1, wherein the first thickness is configured to be between 50 micrometers (μm) and 150 μm and the second thickness is configured to be between 5 μm and 15 μm.

3. The device of claim 1, wherein the second portion is configured to be transparent relative to the first portion, and wherein the photosensitive transistor is configured to detect light emitted through the second portion.

4. The device of claim 1, comprising sensing circuitry configured to couple to the photosensitive transistor, wherein the sensing circuitry is configured to detect a first voltage corresponding to a baseline current value leaked from the photosensitive transistor and a second voltage corresponding to the baseline current value and the data signal generated in response to light emitted from the light-emitting diode during the light emission.

5. The device of claim 1, wherein the data signal is configured to be programmed based at least in part on a previous measurement of additional optical feedback generated in response to light emitted from the light-emitting diode during a previous light emission, and wherein the previous measurement is configured to be used to determine light emission characteristics of the light-emitting diode.

6. The device of claim 1, comprising:
 a second light-emitting diode; and
 a second driving circuitry configured to facilitate light emission from the second light-emitting diode, wherein the second driving circuitry is configured to receive a second data signal, and wherein the second data signal is configured to be programmed based at least in part on light emission characteristics of the second light-emitting diode and based at least in part on light emission characteristics of the light-emitting diode.

7. The device of claim 6, wherein the photosensitive transistor comprises an oxide thin film transistor.

8. The device of claim 1, wherein the photosensitive transistor comprises amorphous silicon (a-Si).

9. An electronic display system comprising:
 a plurality of pixels, wherein each pixel comprises:
  driving circuitry that is configured to receive a respective data signal, wherein the driving circuitry generates a current in response to the respective data signal, wherein the current is used to cause light emission based at least in part on pixel properties and characteristics of a light-emitting diode associated with the pixel, and wherein light emitted by the light-emitting diode during the light emission corresponds at least in part to the driving current and the respective data signal; and
  a photosensitive transistor configured to cause a voltage to change in response to the light emitted by the light-emitting diode during the light emission;
 sensing circuitry configured to measure the voltage; and
 processing circuitry configured to receive an indication of the voltage from the sensing circuitry, wherein the processing circuitry is configured to determine a signal indicative of the light emitted by the light-emitting diode during the light emission for each pixel based at least in part on the voltage.

10. The electronic display system of claim 9, comprising a controller configured to supply a negative voltage to a gate of the photosensitive transistor causing the photosensitive transistor to be operated in a reverse-bias operational state.

11. The electronic display system of claim 9, wherein the photosensitive transistor comprises a thin anode, and wherein the thin anode is thin enough to be substantially transparent to the light from the light-emitting diode but thick enough to be conductive.

12. The electronic display system of claim 9, wherein the respective data signal supplied to a first driving circuitry is greater than an additional data signal supplied to a second driving circuitry, and wherein a difference between the respective data signal and the additional data signal is based at least in part on the voltage and an additional measured voltage associated with the second driving circuitry.

13. The electronic display system of claim 9, wherein the respective data signal is programmed in accordance with a regional adjustment performed by the processing circuitry to a first portion of the plurality of pixels but without changing an additional data signal transmitted to a respective pixel of the plurality of pixels associated with a second portion of the plurality of pixels.

14. The electronic display system of claim 9, wherein the respective data signal is programmed in accordance with a global adjustment applied to each data signal to be transmitted pixel of the plurality of pixels.

15. A method for compensating for non-uniformities of an electronic display, comprising:
   measuring a first voltage corresponding to a leakage current of a pixel;
   causing light to emit from the pixel based at least in part on a data signal configured to be transmitted to the pixel from processing circuitry;
   during light emission, measuring a second voltage corresponding to the first voltage and a third voltage, wherein a photosensitive transistor that is configured to generate voltage in response to the light emission at least in part generates the third voltage;
   determining a difference between the second voltage and the first voltage; and
   adjusting the data signal based at least in part on the difference and non-uniform properties of the pixel.

16. The method of claim 15, comprising:
   subtracting the first voltage from the second voltage to determine a change in voltage sensed, wherein the change in voltage sensed corresponds to an amount of current generated by the photosensitive transistor in response to the light emission;
   subtracting the change in voltage sensed from a previous change in voltage sensed to determine an additional change in voltage sensed; and
   adjusting the data signal based at least in part on the additional change in voltage sensed.

17. The method of claim 15, comprising adjusting an additional data signal based at least in part on the difference and non-uniform properties of a plurality of pixels comprising the pixel.

18. The method of claim 15, comprising applying a voltage configured to cause the photosensitive transistor to operate in a reverse-bias operational state, wherein the photosensitive transistor is configured to generate current in response to detected light while in the reverse-bias operational state.

19. The method of claim 15, comprising:
   storing the difference between the second voltage and the first voltage in a memory at a first time;
   retrieving the difference between the second voltage and the first voltage at a second time, wherein the second time is a later time than the first time;
   adjusting an additional data signal based at least in part on a previously determined voltage difference and the difference between the second voltage and the first voltage; and
   transmitting the additional data signal to an additional pixel.

20. The device of claim 1, wherein a subsequent data signal is generated based at least in part on the optical feedback.

* * * * *